United States Patent
Liu et al.

(10) Patent No.: US 11,272,621 B2
(45) Date of Patent: Mar. 8, 2022

(54) SUBSTRATE AND METHOD FOR FABRICATING FLEXIBLE ELECTRONIC DEVICE AND RIGID SUBSTRATE

(71) Applicant: SHENZHEN ROYOLE TECHNOLOGIES CO., LTD., Guangdong (CN)

(72) Inventors: Zihong Liu, Guangdong (CN); Xiaojun Yu, Guangdong (CN); Peng Wei, Guangdong (CN)

(73) Assignee: SHENZHEN ROYOLE TECHNOLOGIES CO., LTD., Guangdong (CN)

( * ) Notice: Subject to any disclaimer, the term of this patent is extended or adjusted under 35 U.S.C. 154(b) by 338 days.

(21) Appl. No.: 16/283,503

(22) Filed: Feb. 22, 2019

(65) Prior Publication Data
US 2019/0191567 A1      Jun. 20, 2019

Related U.S. Application Data

(63) Continuation-in-part of application No. 14/758,161, filed as application No. PCT/CN2012/087786 on Dec. 28, 2012, now abandoned.

(51) Int. Cl.
*H05K 3/30*       (2006.01)
*H05K 3/00*       (2006.01)
(Continued)

(52) U.S. Cl.
CPC .............. *H05K 3/007* (2013.01); *G02F 1/13* (2013.01); *H01L 51/003* (2013.01);
(Continued)

(58) Field of Classification Search
CPC ...... H05K 1/0393; H05K 1/189; H05K 3/007; H05K 2203/016; H01L 51/003;
(Continued)

(56) References Cited

U.S. PATENT DOCUMENTS 4,985,600 A * 1/1991 Heerman .............. H05K 1/116
                                                           174/255
6,012,221 A    1/2000 Campbell
(Continued)

FOREIGN PATENT DOCUMENTS

CN        1427749 A     7/2003
CN        1734750 A     2/2006
(Continued)

OTHER PUBLICATIONS

International Search Report and Written Opinion (English and Chinese) issued in PCT/CN2012/087786, dated Jun. 6, 2013; 23 pages provided.

(Continued)

*Primary Examiner* — Paul D Kim
(74) *Attorney, Agent, or Firm* — Hamre, Schumann, Mueller & Larson, P.C.

(57) ABSTRACT

A method for fabricating a flexible electronic device, including the steps of: providing channels on a rigid substrate; adhering a flexible substrate to the rigid substrate with an adhesive; fabricating an electronic device on the flexible substrate; injecting a chemical substance into the channels; and reacting the chemical substance with the adhesive and peeling the flexible substrate from the rigid substrate. The rigid substrate comprises a first surface, a second surface opposite the first surface, and a side wall extending between the first surface and the second surface. The channels are provided on the first surface of the rigid substrate. The channels are in communication with an injection port, the injection port is located on the side wall of the rigid substrate, and a portion of the side wall is located between the injection port and the first surface.

19 Claims, 7 Drawing Sheets

(51) Int. Cl.
  *H01L 51/00* (2006.01)
  *G02F 1/13* (2006.01)
  *B32B 43/00* (2006.01)
  *B32B 37/12* (2006.01)
  *B32B 37/00* (2006.01)
  *B32B 38/10* (2006.01)
  *H01L 51/50* (2006.01)

(52) U.S. Cl.
  CPC ...... *H01L 51/0097* (2013.01); *B32B 37/0015* (2013.01); *B32B 37/12* (2013.01); *B32B 38/10* (2013.01); *B32B 43/003* (2013.01); *B32B 43/006* (2013.01); *B32B 2457/00* (2013.01); *H01L 51/50* (2013.01); *H01L 2251/5338* (2013.01); *H05K 2203/016* (2013.01)

(58) Field of Classification Search
  CPC .......... H01L 51/0097; H01L 51/50; H01L 2251/5338; B32B 43/003; B32B 43/006; B32B 37/0015; B32B 37/12; B32B 2457/00; G02F 1/13
  See application file for complete search history.

(56) References Cited

U.S. PATENT DOCUMENTS

| | | | |
|---|---|---|---|
| 6,924,654 B2 | 8/2005 | Karavakis et al. | |
| 7,430,359 B2 * | 9/2008 | Chen | B81B 3/0005 257/678 |
| 7,453,045 B2 | 11/2008 | Myoung et al. | |
| 8,604,485 B2 | 12/2013 | Tang et al. | |
| 2006/0207967 A1 | 9/2006 | Bocko et al. | |
| 2010/0233838 A1 | 9/2010 | Varghese | |
| 2010/0297829 A1 * | 11/2010 | O'Rourke | C09J 5/06 438/459 |
| 2012/0300419 A1 | 11/2012 | Tang et al. | |
| 2015/0348935 A1 * | 12/2015 | O'Rourke | C09J 5/06 438/458 |
| 2016/0052252 A1 * | 2/2016 | Luan | B23K 26/0006 156/712 |

FOREIGN PATENT DOCUMENTS

| | | |
|---|---|---|
| CN | 102651331 A | 8/2012 |
| JP | 2007073798 A | 3/2007 |

OTHER PUBLICATIONS

International Preliminary Report on Patentability (English and Chinese) issued in PCT/CN2012/087786, dated Jun. 30, 2015, 6 page provided.

* cited by examiner

SUBSTRATE AND METHOD FOR FABRICATING FLEXIBLE ELECTRONIC DEVICE AND RIGID SUBSTRATE

CROSS-REFERENCE TO RELATED APPLICATIONS

This application is a continuation in part of U.S. Ser. No. 14/758,161 filed on Dec. 28, 2012, abandoned, which is a National Stage Application of International Patent Application No. PCT/CN2012/087786, with an international filing date of Dec. 28, 2012. The contents of all of the aforementioned applications are incorporated herein by reference.

BACKGROUND

Technical Field

The application belongs to the field of electronic device fabrication, particularly to a method for fabricating a flexible electronic device and a substrate for fabricating the same.

Description of the Related Art

Flexible electronic device is a new electronic technology that an electronic device of an organic/inorganic material is fabricated on a flexible/ductile plastic or a thin metal substrate, and due to the unique flexibility/ductility, and highly efficient and low-cost manufacturing process, it has found a broad application prospect in information, energy, medical, national defense and other fields, such as flexible electronic display, organic light emitting diode (OLED), printed RFID, thin-film solar panel, electronic surface patch (Skin Patches) and so on.

There are many problems present in the flexible substrate, such as fragile, easy-to-wrinkle, deformation, etc., which are particularly prominent in the actual fabrication process. The common method for fabricating a flexible electronic device is adhering a flexible substrate to a rigid substrate with a specific adhesive, then fabricating an electronic device on the side of the flexible substrate away from the rigid substrate, finally removing the adhesive by heating or laser melt-cutting method, thus peeling the flexible substrate from the rigid substrate to obtain a flexible electronic device, wherein the flexible electronic device is a flexible substrate provided with an electronic device. Although the two peeling methods have improved the peeling effects between the flexible substrate and the rigid substrate to some extent by the continuous improvement in the process conditions, the problems that the adhesive cannot be completely peeled off and the flexible substrate is damaged are still present, and the peeling process conditions are difficult to control, thus not facilitating the fabrication of a high-quality flexible electronic device.

SUMMARY

In view of the above-described problems, it is an object of the present application to provide a method and a substrate for fabricating a flexible electronic device, which may avoid the flexible substrate from deformation or warpage phenomenon during fabricating the electronic device as well as effectively increase the rate for peeling the flexible substrate from the rigid substrate.

To achieve the above objects, in accordance with some embodiments of the present application, there is provided a method for fabricating a flexible electronic device. The method comprising the steps of: providing channels on a rigid substrate; adhering a flexible substrate to the rigid substrate with an adhesive; fabricating an electronic device on the flexible substrate; injecting a chemical substance into the channels; and reacting the chemical substance with the adhesive and peeling the flexible substrate from the rigid substrate. The rigid substrate comprises a first surface, a second surface opposite the first surface, and a side wall extending between the first surface and the second surface. The channels are micro-channels, patterns, textures, or grooves provided on the first surface of the rigid substrate. The channels are in communication with at least one injection port, the at least one injection port is located on the side wall of the rigid substrate. A portion of the side wall is located between each of the at least one injection port and the first surface.

In accordance with some embodiments, the channels are interconnected.

In accordance with some embodiments, the number of the at least one injection port is no more than the number of the channels.

In accordance with some embodiments, each of the at least one injection port provided on the side wall comprises a top edge approximate the first surface of the rigid substrate and a bottom edge opposite the top edge, a distance between a highest point of the top edge of each of the at least one injection port and the first surface is greater than 0 micrometer.

In accordance with some embodiments, the top edge is linear or arcuate.

In accordance with some embodiments, a height of each of the at least one injection port is less than a height of each of the channels.

In accordance with some embodiments, a thickness of a lower portion of the adhesive inside the channels is less than a thickness of an upper portion of the adhesive outside the channels.

In accordance with some embodiments, the step of fabricating an electronic device on the flexible substrate comprises: providing at least one of the electronic devices and wirings in electrical connection on a surface of the flexible substrate.

In accordance with some embodiments, the step of injecting the chemical substance into the channels comprises: injecting the chemical substance into the at least one injection port of the rigid substrate and making the chemical substance flow into the channels via the at least one injection port.

In accordance with some embodiments, the adhesive is silica gel, rubber, epoxy, or phenolic resin.

In accordance with some embodiments, the chemical substance is a chemical solvent or gas capable of dissolving the adhesive; in which, the chemical solvent is acetone or isopropanol; and the gas is fluorinated gas.

In accordance with some embodiments, after the fabrication of the electronic device on the flexible substrate is completed and before the rigid substrate is peeled, a cutting step is carried out.

In accordance with other embodiments of the present application, there is provided a substrate for fabricating a flexible electronic device. The substrate for fabricating a flexible electronic device comprises: a flexible electronic device, a rigid substrate provided with channels, and an adhesive applied to the rigid substrate and filled into the channels. The rigid substrate comprises a first surface, a second surface opposite the first surface, and a side wall extending between the first surface and the second surface.

The channels are micro-channels, patterns, textures, or grooves provided on the first surface of the rigid substrate. The channels are in communication with at least one injection port, and the at least one injection port is located on the side wall of the rigid substrate and wherein a portion of the side wall is located between each of the at least one injection port and the first surface. The adhesive adheres the flexible electronic device to the rigid substrate via the adhesive.

In accordance with some embodiments, the channels are interconnected on the first surface of the rigid substrate.

In accordance with some embodiments, the number of the at least one injection port is no more than the number of the channels In accordance with some embodiments, the flexible electronic devices comprises: a flexible substrate, and an electronic device provided on a side of the flexible substrate away from the rigid substrate.

In accordance with some embodiments, each of the at least one injection port provided on the side wall comprises a top edge approximate the first surface of the rigid substrate and a bottom edge opposite the top edge, a distance between a highest point of the top edge of each of the at least one injection port and the first surface is greater than 0 micrometer.

In accordance with some embodiments, the top edge is linear or arcuate.

In the present application, channels with an injection port or via holes are provided on the rigid substrate to contact and react the chemical substance with the adhesive, so that the rigid substrate is completely and automatically peeled, and the used reaction conditions of the chemical substance and the adhesive will not cause a damage to the flexible substrate or the electronic device. By applying this method, it can be ensured that the flexible substrate will not occur the deformation or warpage phenomenon during fabricating the electronic device.

DETAILED DESCRIPTION OF THE EMBODIMENTS

In order to make the objects, technical solutions, and advantages of the present application more apparent, the present application will be further described in detail in combination with the following accompanying drawings and examples. It should be understood that the particular embodiments described herein are merely to illustrate the present application and are not intended to limit the same.

Figure 1:
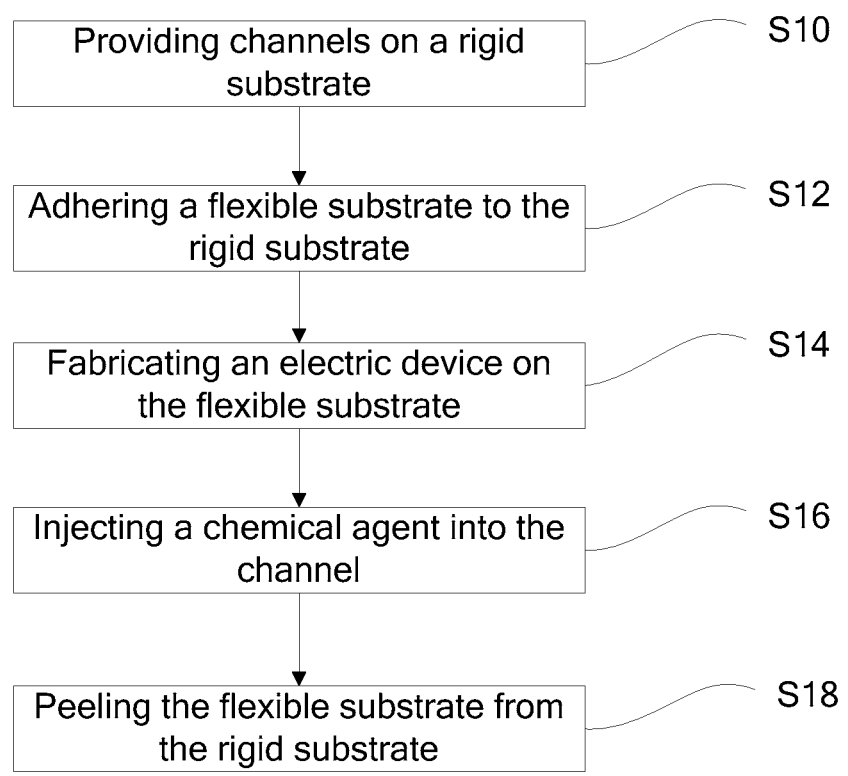
FIG. 1 is a flow chart of a method for fabricating a flexible electronic device according to embodiments of the present application.
Figure 2:
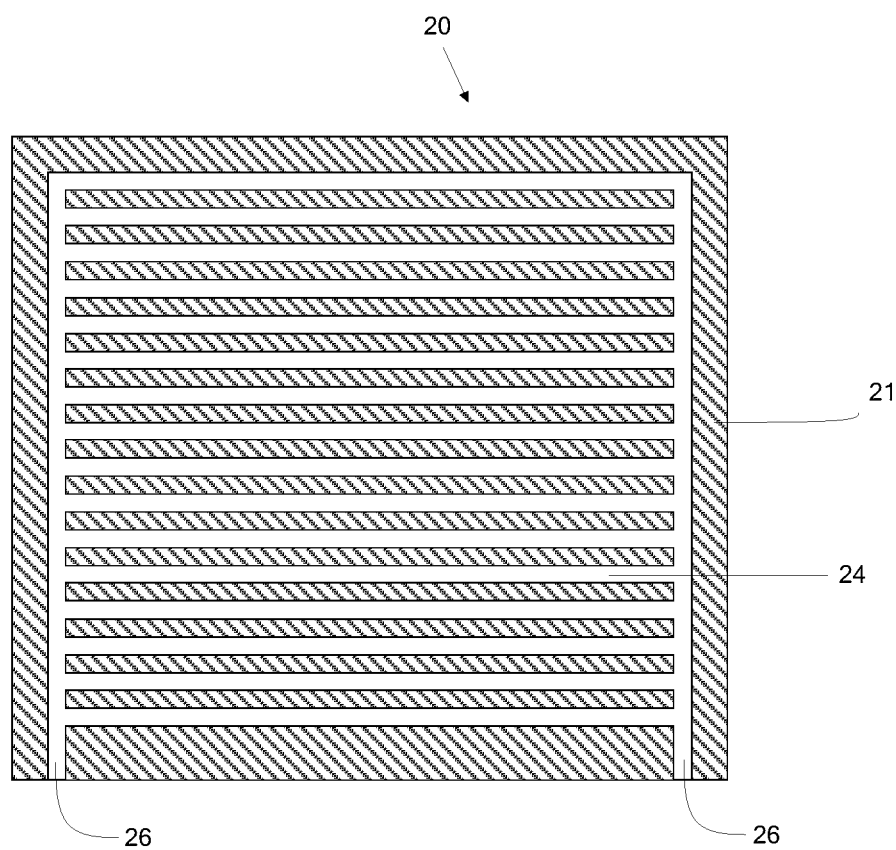
FIG. 2 is a schematic plan view of a channel distribution of a rigid substrate according to some embodiments of the present application.

As shown in FIG. 1, a method for fabricating a flexible electronic device according to embodiments of the present application, comprises the steps of:

providing channels 24 on a rigid substrate 20;

adhering a flexible substrate 40 to the rigid substrate 20 with an adhesive 60;

fabricating an electronic device 80 on the flexible substrate 40;

injecting a chemical substance 200 into the channels 24; and reacting the chemical substance 200 with the adhesive 60, and peeling the flexible substrate 40 from the rigid substrate 20.

In the above-described fabrication method, the channels 24 where the chemical substance 200 is injected are provided on the rigid substrate 20, and allows the chemical substance 200 to chemically react with the adhesive 60 adhered between the rigid substrate 20 and the flexible substrate 40 along the channels 24, so that the adhesive 60 is dissolved to peel the rigid substrate 20 from the flexible substrate 40. In addition, due to the chemical reaction between the chemical substance 200 and the adhesive 60, the adhesive 60 can be completely removed, and therefore the flexible substrate 20 can be completely peel off without damage, thereby facilitating the fabrication of a high-quality flexible electronic device.

According to some embodiments, the rigid substrate 20 is a quartz substrate or a glass substrate, but is not limited thereto. The rigid substrate 20 mainly provides a support effect for a subsequent fabrication process of the electronic device 80 so as to prevent the flexible substrate 20 from phenomena including breakages, winkles, deformations.

As shown in FIGS. 3-6 and 8-9, the rigid substrate 20 comprises a first surface 21, a second surface 22 opposite to the first surface 21, and a side wall 23 extending between the first surface 21 and the second surface 22. The first surface 21 faces towards the flexible substrate 40.

According to some embodiments of the present application, as shown in FIGS. 2-6, the channels 24 are micro-channels, patterns, textures, or grooves provided on the first surface 21 of the rigid substrate 20. The planar view of the channels 24 can be in any shape, i.e. there is no limitation to the shape. The channels 24 are formed by etching or laser engraving. The channels 24 are in communication with at least one injection port 26, and the at least one injection port is located on the side wall 23 of the rigid substrate 20. The respective injection port 26 may be in a square, circular or other shapes, which are not limited herein, and may be formed by etching or laser engraving.

In some embodiments, each channel may be provided with an injection port 26, so that the chemical substance 200 flows into the channels 24 along corresponding injection ports 26 respectively to react with the adhesive 60.

In other embodiments, the channels 24 are interconnected. In optional, the number of the injection port 26 may be one, i.e. the chemical substance 200 flows into the channels 24 along the one injection port 26, or alternatively, the number of the injection port 26 may be between two and the same number as that of the channels 24, so that the chemical substance 200 can flow into the channels 24 along any one of injection ports 26, thus speeding up the reaction rate of the chemical substance 200 and the adhesive 60.

Figure 4:
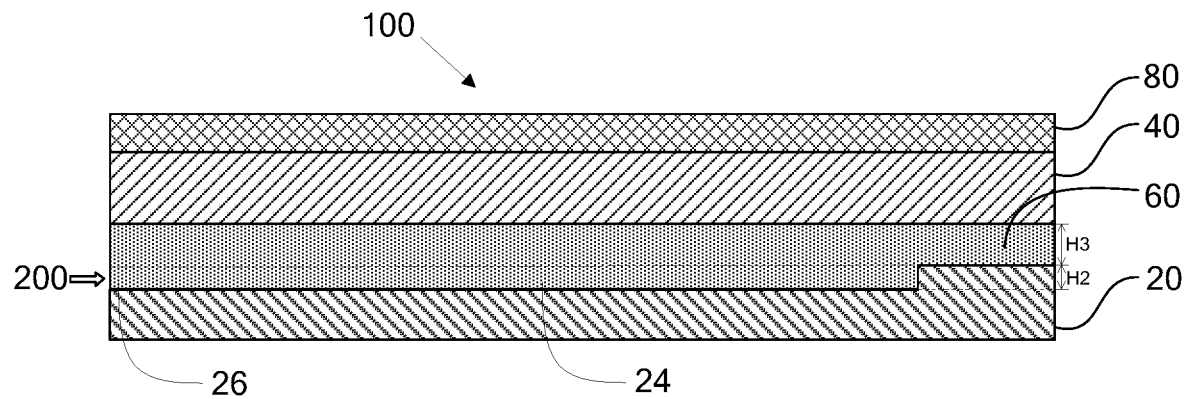
FIG. 4 is a schematic cross-sectional view of a substrate for fabricating the flexible electronic device, including the rigid substrate of FIG. 3, according to some embodiments of the present application.
Figure 6:
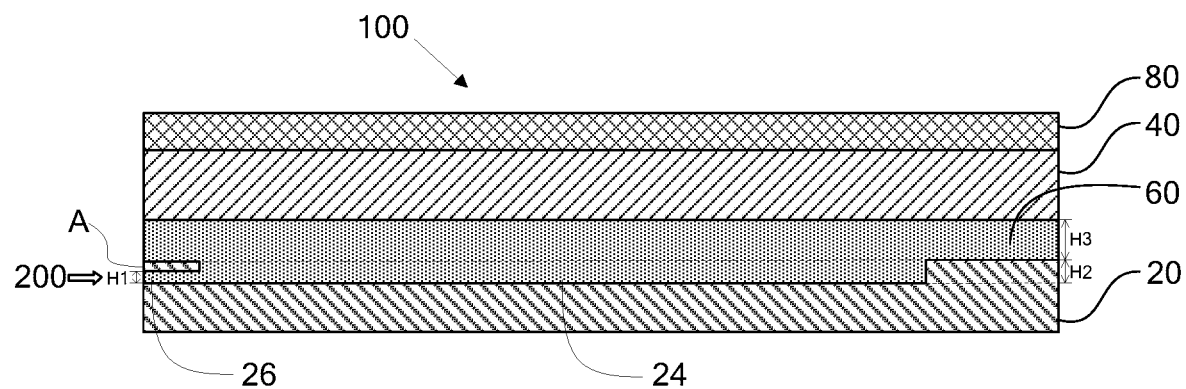
FIG. 6 is a schematic cross-sectional view of a substrate for fabricating the flexible electronic device, including the rigid substrate of FIG. 5, according to some embodiments of the present application.

As shown in FIGS. 4 and 6, a lower portion of the adhesive is filled inside the channels, and an upper portion of the adhesive outside the channels are adhered between the first surface 21 of the rigid substrate 20 and the flexible substrate 40. A thickness, as indicated by H2, of the lower portion of the adhesive 60 inside the channels 24 is less than a thickness, as indicated by H3, of an upper portion of the adhesive 60 outside the channels 24.

Figure 3:
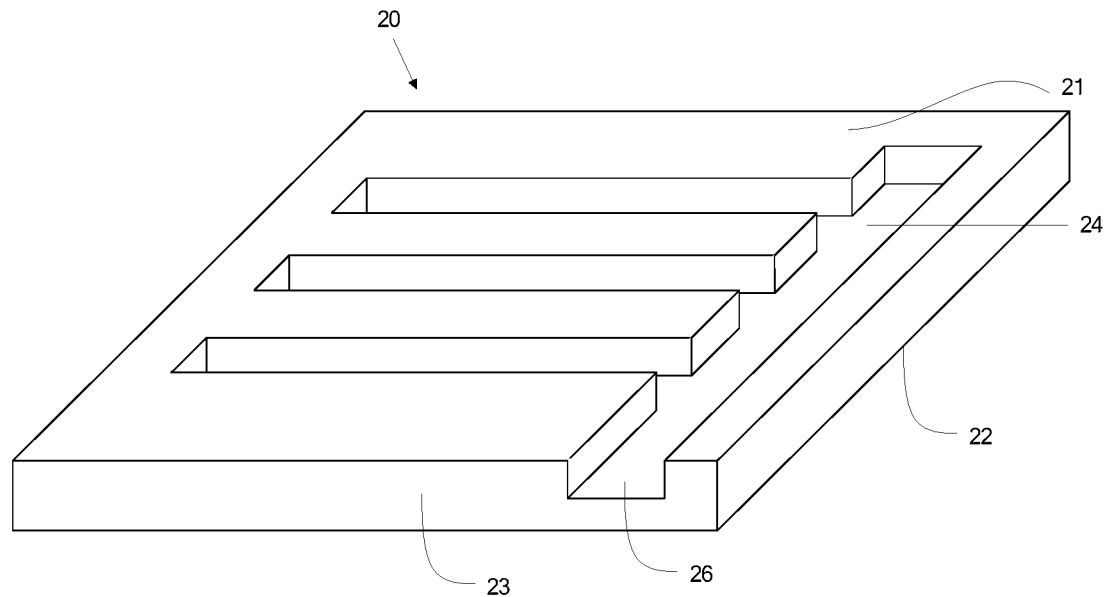
FIG. 3 is a schematic perspective view of a channel distribution of a rigid substrate according to some embodiments of the present application.

In some embodiments, as shown in FIGS. 3-4, each injection port 26 provided on the side wall 23 includes a top edge approximate the first surface of the rigid substrate and a bottom edge opposite the top edge. The top edge of each injection port 26 may be linear or arcuate. A highest point of the top edge aligns with a top edge of the channel 24, that is, each injection port 26 provided on the side wall 23 is concaved from the first surface 21 of the rigid substrate.

Figure 5:
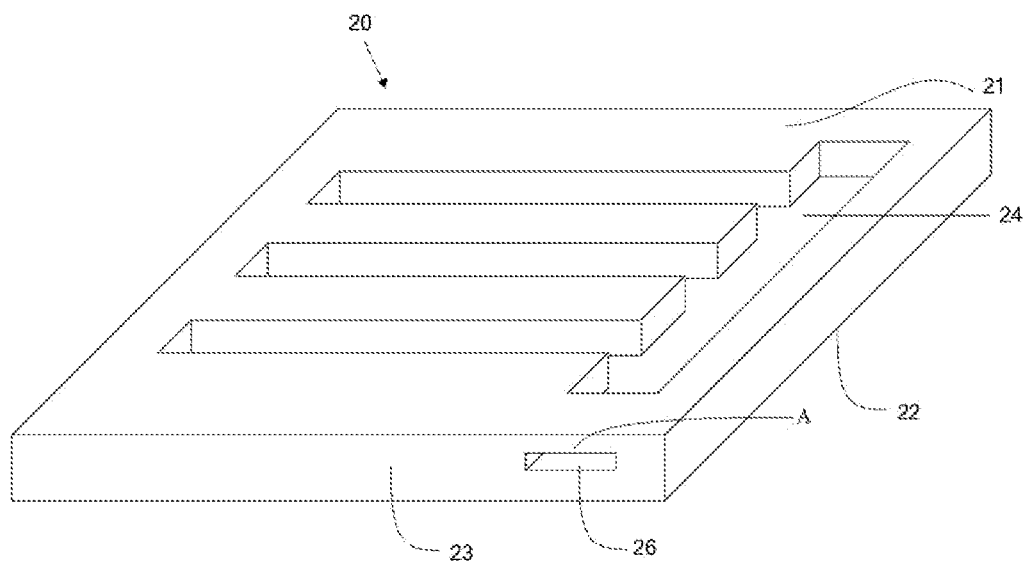
FIG. 5 is a schematic perspective view of another channel distribution of a rigid substrate according to some embodiments of the present application.

In some other embodiments, as shown in FIGS. 5-6, a portion (as indicated by part A) of the side wall 23 is located between each injection port 26 and the first surface 21. In optional, each injection port 26 provided on the side wall 23 includes a top edge approximate the first surface of the rigid substrate and a bottom edge opposite the top edge, and the top edge of each injection port 26 may be linear or arcuate. A distance between a highest point of the top edge of each injection port 26 and the first surface 21 is greater than 0 micrometer. A height H1 of each injection port 16 is smaller than a height H2 of each channel 24. The height difference between the respective injection port 16 and the respective channel 24 may be helpful for avoiding the overflowing of the chemical substance 200 from the injection port 16.

As described in the above, when the channels are provided on the first surface 21 of the rigid substrate, the at least one injection port in communication with the channels is located on the side wall of the rigid substrate. In some other embodiments, the injection port 26 may also be provided on the second surface 22 and interconnected with the channels 24, such that the chemical substance 200 may be injected via the injection port 26 to contact with the adhesive 60.

Figure 7:
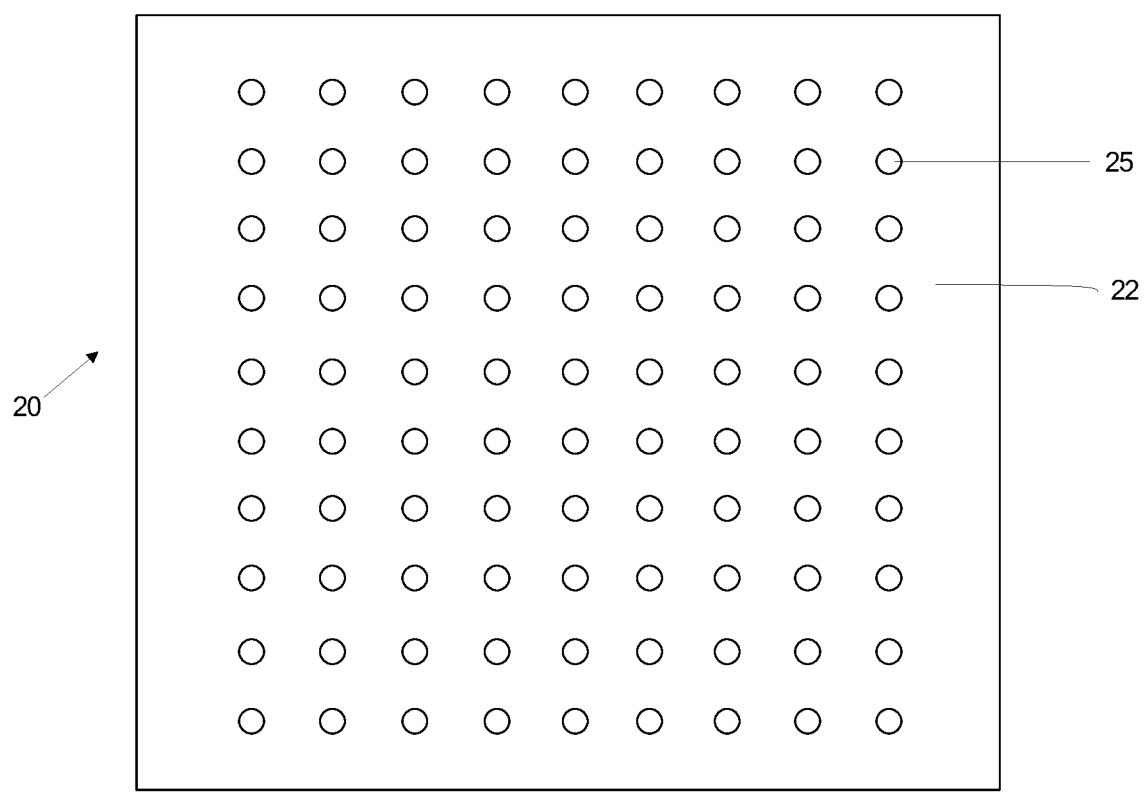
FIG. 7 is a schematic plan view of via hole distribution of a rigid substrate according to some other embodiments of the present application.
Figure 8:
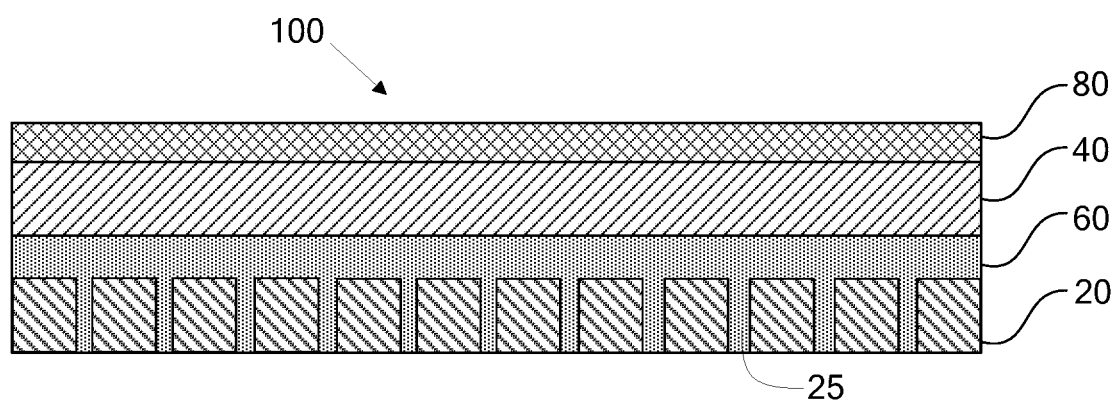
FIG. 8 is a schematic cross-sectional view of a substrate for fabricating a flexible electronic device, including the rigid substrate of FIG. 7, according to some embodiments of the present application.
Figure 9:
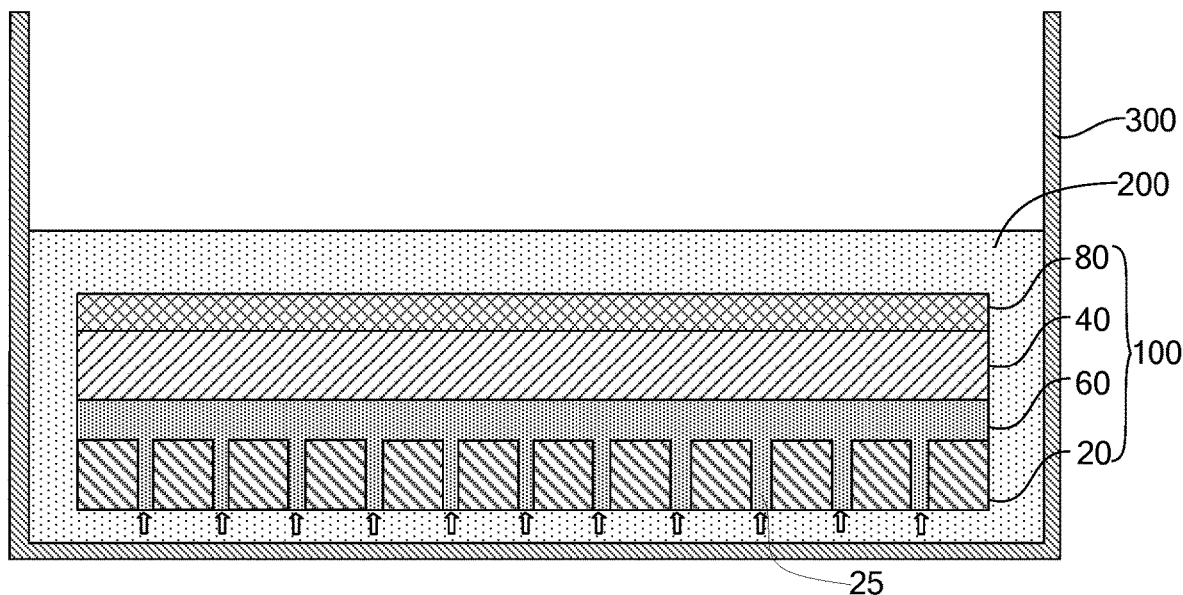
FIG. 9 is a schematic cross-sectional view of the substrate for fabricating a flexible electronic device, including the rigid substrate of FIG. 7 and placed into a reaction vessel containing a chemical solvent, according to the some embodiments of the example of the present application.

In some other embodiments of the present application, as shown in FIGS. 7-9, the channels 24 are via holes 25 extending from the first surface 21 of the rigid substrate 20 to the second surface 22 of the rigid substrate. The via holes 25 may be formed by etching or laser engraving. In order to effectively contact and react the chemical substance 200 with the adhesive 60, a plurality of the via holes 25 may be provided, and the number of the via holes 25 can be determined based on the size of the rigid substrate 20.

In some embodiments of the present application, the adhesive 60 is firstly applied to the first surface 21 of the rigid substrate 20 and the adhesive 60 is filled into the channels 24. The adhesive 60 may be an adhesive polymer or a film, and the adhesive polymer may be silica gel, rubber, epoxy or phenolic resin, and the like. When the adhesive 60 is applied, a dip coating method, a roll coating method, a die coating method, a spray coating method, a curtain coating method, a spin coating method or a dispensing method, etc.,
can be used. Dip coating method is carried out as follows: the first surface 21 of the rigid substrate 20 is immersed in a tank containing the adhesive 60 for a very short time, then the rigid substrate 20 is taken out from the tank and the excess adhesive 60 flows back into the tank. When the adhesive 60 is applied with a roll coating method, die coating method, spray coating method, curtain coating method or spin coating method, the adhesive 60 should be uniformly applied to the first surface 21. When the adhesive 60 is applied with the dispensing method, the adhesive 60 can form a plurality of adhesive patterns on the first surface 21, and the adhesive pattern should be uniformly distributed on the first surface 21.

Thereafter, the flexible substrate 40 is adhered to the rigid substrate 20 with the adhesive 60. In particular, the flexible substrate 40 is covered on the adhesive 60, and the flexible substrate 40 is adhered to the rigid substrate 20 by curing the adhesive 60. In these embodiments, the manner for adhering the flexible substrate 40 to the rigid substrate 20 may be the common pressing or rolling, but is not limited thereto. The flexible substrate 40 may be a glass film substrate, stainless steel film substrate or plastic substrate, but is not limited thereto. The flexible substrate 40 has a thickness in a range of 5.5~550 micrometer.

In some other embodiments, the adhesive 60 may also be firstly applied to the flexible substrate 40, and the flexible substrate 40 is adhered to the rigid substrate 20 by curing the adhesive 60.

As shown in FIGS. 4, 6, and 8, the electronic device 80 is fabricated on the flexible substrate 40. Due to the support effect of the rigid substrate 20, the fabrication of the electronic device 80 on the flexible substrate 40 adhered to the rigid substrate 20 can effectively prevent the flexible substrate 40 form occurring the phenomena, such as breakage, winkle and deformation during fabricating the electronic device 80. The step of the step of fabricating an electronic device on the flexible substrate includes: providing at least one of the electronic devices 80 and wirings in electrical connection on a surface of the flexible substrate 20. The electronic device 80 may be a display element, a thin film transistor, a capacitor, or a resistor, and the like, but is not limited thereto. During fabricating the electronic device 80, the longitudinal direction of the electronic device 80 should keep away from the bending direction of the flexible substrate 40, so as to prevent the damage to the electronic device 80 when the flexible substrate 40 is bent. For example, when the electronic device 80 is a display element, an organic light-emitting diode is fabricated and packaged on the flexible substrate 40. The method for packaging the light emitting diode comprises metal packaging method, glass packaging method, plastic packaging method or film packaging method, but is not limited thereto.

The chemical substance 200 may be a substance capable of dissolving the adhesive 60, and it may be a chemical solvent or gas. The chemical solvent is acetone, isopropanol, or other dissolving agents. The gas may be a corrosive gas, such as fluorinated gas.

In some embodiments of the present application, as shown in FIGS. 4 and 6, for the rigid substrate 20 where the channels 24 are defined on the first surface 21 thereof and the at least one injection port 26 in communication with the channels 24 is located on the side wall 23 of the rigid substrate 20, the step of injecting the chemical substance 200 into the channels 24 comprises: injecting the chemical substance 200 into the injection port 26 of the rigid substrate 20, and allowing the chemical substance 200 to flow into the channels 24 along the injection port 26 so as to contact and react with the adhesive 60 subsequently. In particular, a chemical solvent, such as acetone or isopropanol, is injected into the injection port 26 of the rigid substrate 20, and the chemical substance flows into the channels 24 along the injection port 26 so as to contact and chemically react with the adhesive 60, such as a rubber, an epoxy, or a phenolic resin, so that the adhesive 60 is dissolved to peel the flexible substrate 40 from the rigid substrate 20, thus forming the flexible electronic device comprising the flexible substrate 40 and the electronic device 80.

In some other embodiments of the present application, as shown in FIG. 9, for the rigid substrate 20 where the channels 24 are in the form of via holes 25 extending from the first surface 21 to the second surface 22 of the rigid substrate 20, the step of injecting the chemical substance 200 into the channels 24 comprises: immersing the flexible substrate 40 and the rigid substrate 20 in a reaction vessel 300 containing the chemical substance 200, and the chemical substance 200 contacts and reacts with the adhesive 60 along the via holes 25. In particular, in the reaction vessel 300 containing a chemical solvent such as acetone or isopropanol, acetone or isopropanol contacts and reacts with the adhesive 60, such as the rubber, the epoxy, or the phenolic resin along the via holes 25, so that the adhesive 60 is dissolved to peel the flexible substrate 40 from the rigid substrate 20, thus forming the flexible electronic device comprising the flexible substrate 40 and the electronic devices 80.

According to the above embodiments, as shown in FIG. 9, a fluorinated gas e.g., xenon fluoride, chlorine trifluoride, bromine trifluoride, or fluorine gas is filled in the reaction vessel 300, and a silica gel adhesive 60 is dissolved. In the reaction vessel 300 filled with xenon fluoride, the silica gel adhesive 60 carries out an isotropic chemical reaction with a fluorinated gas such as xenon fluoride, and the produced xenon gas and silicon tetrafluoride gas escape. When chlorine trifluoride, bromine trifluoride, or fluorine gas is selected as the fluorinated gas, the reaction product of the silica gel adhesive 60 and the fluorinated gas is still an escaping gas, such as chlorine gas and silicon tetrafluoride gas, and as the silica gel adhesive 60 is completely reacted with the fluorinated gas, there are neither new additional foreign impurities, nor the residual silica gel adhesive 60 in the reaction process.

In summary, the chemical solvent or gas reacts with the adhesive 60 through the injection ports 26 or via holes 25, so that the rigid substrate 20 is automatically and completely peeled off, thus effectively preventing the incomplete peeling phenomenon. And, the solubility of the acetone or isopropanol to the adhesive 60 and the reaction condition of the fluorinated gas and the silica gel adhesive 60 hardly cause a damage to the flexible substrates 40 and the electronic device 80, thus effectively avoiding the effect on the performances of the flexible substrate 40 and the electronic device 80 during peeling the rigid substrate 20, and, during peeling off the rigid substrate 20, the electronic device 80 and the circuit thereof will not be affected, thus facilitating the fabrication of a high-quality flexible electronic device.

In some embodiments of the present application, a plurality of via holes 25 are designed to contact and react the chemical solvent or gas with the adhesive 60 in a large area range, so as to peel off the rigid substrate 20, thus accelerating the peeling speed, and also achieving the effect of effective peeling.

In order to accelerate the reaction between the chemical substance 200 with the adhesive 60, the size of the injection port 26 can be increased or the channel 24 is exposed on the side of the rigid substrate 20, so as to expose the adhesive 60, thus increasing the contact area between the chemical substance 200 and the adhesive 60, and accelerating the reaction.

According to some embodiments of the present application, there is also provided a substrate for fabricating a flexible electronic device, as shown in FIGS. 4, 6, and 8, comprises: a flexible electronic device, a rigid substrate 20 provided with channels 24, and an adhesive 60 applied to the rigid substrate 20 and filled into in the channels. The adhesive 60 adheres the flexible electronic device to the rigid substrate 20. The rigid substrate 20 comprises: a first surface 21, a second surface 22 opposite the first surface 21, and a side wall 23 extending between the first surface 21 and the second surface 22.

In some embodiments, as shown in FIGS. 2-6, the channels 24 may be micro-channels, patterns, textures, or groove provided on the first surface 21 of the rigid substrate 20, and has at least one injection port 26 located on the side wall 23 of the rigid substrate 20. Each injection port 26 provided on the side wall 23 includes a bottom edge and a top edge, and the top edge of each injection port 26 may be linear or arcuate. Optionally, as shown in FIG. 3-4, a highest point of the top edge aligns with a top edge of the channel 24, that is, each injection port 26 provided on the side wall 23 is concaved from the first surface 21 of the rigid substrate. Or alternatively, as shown in FIGS. 5-6, a portion (as indicated by part A) of the side wall 23 is located between each injection port 26 and the first surface 21. A distance between a highest point of the top edge of each injection port 26 and the first surface 21 is greater than 0 micrometer. A height H1 of each injection port 16 is smaller than a height H2 of each channel 24.

In some other embodiments, as shown in FIGS. 7-8, the rigid substrate 20 is provided with a plurality of via holes 25 extending through the rigid substrate 20, in particular, the via holes 25 extend from the first surface 21 of the rigid substrate 20 to the second surface 22.

The flexible electronic device comprises the flexible substrate 20 and the electronic device 80 which is provided on the flexible substrate 40 and located on the side of the flexible substrate 40 away from the rigid substrate 20. The flexible electronic device after being peeling off from the rigid substrate 20 can be applied in the electronic device, thus improving the application range of the flexible electronic device, for example, it can be applied in flexible display, mobile phone, disk drive, CD walkman, and the like.

In the present application, the channels 24 with the injection port 26 or the via holes 25 are provided on the rigid substrate 20, to contact and react the chemical substance 200 with the adhesive 60, so that the rigid substrate 20 is completely and automatically peeled, and the used reaction conditions of the chemical substance 200 and the adhesive 60 will no cause a damage to the flexible substrate 40 or the electronic devices 80. By applying the method, it can be ensured that the flexible substrate 40 will not occur the phenomenon, such as deformation or warpage during fabricating the electronic device 80 so as to form a high-quality flexible electronic device, and effectively increase the rate for peeling the flexible substrate 40 from the rigid substrate 20, thus facilitating its application in production.

The method for fabricating a flexible electronic device according to the present application is suitable to the case that a plurality of the flexible substrates 40 are integrated together to carry out a large area fabrication, after the fabrication of the electronic device 80 on the flexible substrate 40 is completed and before the rigid substrate 20 is peeled, a cutting step is carried out, which cannot only separate a plurality of the flexible substrates 40, but also expose the adhesive 60, so that the chemical substance 200 can rapidly react with the adhesive 60, thereby speeding up the rate of peeling the rigid substrate 20.

Unless otherwise indicated, the numerical ranges involved in the present application include the end values. While particular embodiments of the present application have been shown and described, it will be obvious to those skilled in the art that changes and modifications may be made without departing from the present application in its broader aspects, and therefore, the aim in the appended claims is to cover all such changes and modifications as fall within the true spirit and scope of the present application.

What is claimed is:

1. A substrate, comprising:
a flexible electronic device;
a rigid substrate provided with channels; and
an adhesive applied to the rigid substrate and filled into the channels;
wherein the rigid substrate comprises a first surface, a second surface opposite the first surface, and a side wall extending between the first surface and the second surface;
wherein the channels are micro-channels, patterns, textures, or grooves provided on the first surface of the rigid substrate;
wherein the channels are in communication with at least one injection port, and the injection port is located on the side wall of the rigid substrate and wherein a portion of the side wall is located between the injection port and the first surface;
wherein the flexible electronic device is adhered to the rigid substrate via the adhesive; and
wherein of the injection port provided on the side wall comprises a top edge approximate the first surface of the rigid substrate and a bottom edge opposite the top edge, a distance between a highest point of the top edge of the injection port and the first surface is greater than 0 micrometer.

2. The substrate according to claim 1, wherein the channels are interconnected on the first surface of the rigid substrate.

3. The substrate according to claim 2, wherein the injection port is one of a plurality of injection ports, and a number of the injection ports of the plurality of injection ports is no more than the number of the channels.

4. The substrate according to claim 1, wherein the flexible electronic device comprises: a flexible substrate, and an electronic device provided on a side of the flexible substrate away from the rigid substrate.

5. The substrate according to claim 1, wherein the top edge is linear or arcuate.

6. A method for fabricating a device including a flexible electronic device, comprising:
providing a substrate, the substrate comprising: the flexible electronic device, a rigid substrate provided with channels, and an adhesive applied to the rigid substrate and filled into the channels; and the flexible electronic device being adhered to the rigid substrate via the adhesive;
injecting a chemical substance into the channels; and
reacting the chemical substance with the adhesive and peeling the flexible electronic device from the rigid substrate;
wherein the rigid substrate comprises a first surface, a second surface opposite the first surface, and a side wall extending between the first surface and the second surface;
wherein the channels are micro-channels, patterns, textures, or grooves provided on the first surface of the rigid substrate;
wherein the channels are in communication with an injection port, and the injection port is located on the side wall of the rigid substrate and wherein a portion of the side wall is located between the injection port and the first surface; and
wherein the injection port provided on the side wall comprises a top edge approximate the first surface of the rigid substrate and a bottom edge opposite the top edge, and a distance between a highest point of the top edge and the first surface is greater than 0 micrometer.

7. The method of claim 6, wherein the channels are interconnected on the first surface of the rigid substrate.

8. The method of claim 7, wherein the number of the injection port is no more than the number of the channels.

9. The method of claim 6, wherein the flexible electronic device comprises: a flexible substrate, and an electronic device provided on a side of the flexible substrate away from the rigid substrate.

10. The method of claim 6, wherein the top edge is linear or arcuate.

11. The method of claim 6, wherein a height of each of the injection port is less than a height of each of the channels.

12. The method of claim 6, wherein a thickness of a lower portion of the adhesive inside the channels is less than a thickness of an upper portion of the adhesive outside the channels.

13. The method of claim 6, wherein the step of injecting the chemical substance into the channels comprises:
injecting the chemical substance into the injection port of the rigid substrate and making the chemical substance flow into the channels via the injection port.

14. The method of claim 6, wherein the adhesive is silica gel, rubber, epoxy, or phenolic resin.

15. The method of claim 6, wherein the chemical substance is a chemical solvent or gas capable of dissolving the adhesive, wherein the chemical solvent is acetone or isopropanol, and the gas is fluorinated gas.

16. A rigid substrate, comprising:
a first surface;
a second surface opposite the first surface;
a side wall extending between the first surface and the second surface; and
channels in the form of micro-channels, patterns, textures, or grooves are provided on the first surface of the rigid substrate, wherein
the channels are in communication with an injection port, wherein
the injection port is located on the side wall of the rigid substrate, and a portion of the side wall is located between the injection port and the first surface; and
the injection port provided on the side wall comprises a top edge approximate the first surface of the rigid substrate and a bottom edge opposite the top edge, and a distance between a highest point of the top edge and the first surface is greater than 0 micrometer.

17. The rigid substrate according to claim 16, wherein the channels are interconnected on the first surface of the rigid substrate; and the number of the injection port is no more than the number of the channels.

18. The rigid substrate according to claim 16, wherein the top edge is linear or arcuate.

19. The rigid substrate according to claim 16, wherein a height of each of the injection port is less than a height of each of the channels.

\* \* \* \* \*